United States Patent
Wang et al.

(10) Patent No.: US 12,046,468 B2
(45) Date of Patent: Jul. 23, 2024

(54) CONFORMAL SILICON-GERMANIUM FILM DEPOSITION

(71) Applicant: Applied Materials, Inc., Santa Clara, CA (US)

(72) Inventors: Huiyuan Wang, Santa Clara, CA (US); Susmit Singha Roy, Sunnyvale, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/953,569

(22) Filed: Nov. 20, 2020

(65) Prior Publication Data
US 2022/0165566 A1   May 26, 2022

(51) Int. Cl.
*H01L 21/02* (2006.01)
(52) U.S. Cl.
CPC .. *H01L 21/02274* (2013.01); *H01L 21/02211* (2013.01); *H01L 21/0245* (2013.01); *H01L 21/02532* (2013.01)

(58) Field of Classification Search
CPC ......... H01L 21/02274; H01L 21/02211; H01L 21/0245; H01L 21/02532
See application file for complete search history.

(56) References Cited

U.S. PATENT DOCUMENTS

| | | | |
|---|---|---|---|
| 8,263,474 B2 | 9/2012 | Dip et al. | |
| 10,731,249 B2 * | 8/2020 | Hatanpää | C23C 16/406 |
| 2003/0005956 A1 * | 1/2003 | Hirata | H01L 31/02161 257/E31.13 |
| 2006/0172068 A1 | 8/2006 | Ovshinsky | |
| 2018/0294182 A1 * | 10/2018 | Wang | H01L 21/02381 |
| 2020/0043730 A1 | 2/2020 | Huang et al. | |
| 2020/0044037 A1 * | 2/2020 | Tai | H01L 29/41791 |
| 2021/0407900 A1 * | 12/2021 | Yu | H01L 29/4175 |
| 2021/0407993 A1 * | 12/2021 | Ju | H01L 29/41791 |
| 2021/0407996 A1 * | 12/2021 | Agrawal | H01L 29/78618 |

FOREIGN PATENT DOCUMENTS

| | | |
|---|---|---|
| KR | 20100106112 A | 10/2010 |
| KR | 20170054263 A | 5/2017 |
| WO | 0003061 A1 | 1/2000 |

OTHER PUBLICATIONS

PCT International Search Report and Written Opinion in PCT/2021/059327 dated Mar. 11, 2022, 10 pages.
Bozzo, S., et al., "Chemical vapor deposition of silicon-germanium heterostructures (Abstract only)", Journal of Crystal Growth, vol. 216, Issues 1-4, Jun. 15, 2000, pp. 171-184.

* cited by examiner

*Primary Examiner* — Monica D Harrison
*Assistant Examiner* — Andre C Stevenson
(74) *Attorney, Agent, or Firm* — Servilla Whitney LLC (57) ABSTRACT

Methods for depositing a silicon-germanium film on a substrate are described. The method comprises exposing a substrate to a silicon precursor and a germanium precursor to form a conformal silicon-germanium film. The substrate comprises at least one film stack and at least one feature, the film stack comprising alternating layers of silicon and silicon-germanium. The silicon-germanium film has a conformality greater than 50%.

17 Claims, 5 Drawing Sheets

CONFORMAL SILICON-GERMANIUM FILM DEPOSITION

TECHNICAL FIELD

Embodiments of the present disclosure pertain to the field of electronic device manufacturing, and, in particular, to integrated circuit (IC) manufacturing. More particularly, embodiments of the disclosure provide methods of depositing a film by thermal chemical vapor deposition (CVD) and plasma-enhanced chemical vapor deposition (PECVD).

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

Deposition of films on a substrate surface is an important process in a variety of industries including semiconductor processing, semiconductor manufacturing equipment, diffusion barrier coatings, and dielectrics for magnetic read/write heads. In the semiconductor industry, as an example, miniaturization requires atomic-level control of thin film deposition to produce conformal coatings on high aspect structures.

One method for deposition of films is atomic layer deposition (ALD). Most ALD processes are based on binary reaction sequences where each of the two surface reactions occurs sequentially. Because the surface reactions are sequential, the two gas-phase reactants are not in contact, and possible gas phase reactions that may form and deposit particles are limited. Traditionally, ALD tends to result in more conformal films than CVD.

Conventional CVD processes utilize furnace-based silicon-germanium/silicon layer deposition, which is sensitive to issues, including wafer-to-wafer uniformity, wafer-in-wafer uniformity, and compositional uniformity. There is a need, therefore, for improved methods of depositing silicon-germanium films.

SUMMARY

Methods to deposit films are described. In one or more embodiments, a method of depositing a film comprises: exposing a substrate to a silicon precursor and a germanium precursor to form a conformal silicon-germanium film on the substrate, the substrate comprising at least one film stack and at least one feature, the film stack comprising alternating layers of silicon and silicon-germanium.

In one or more embodiments, a method of depositing a film is described. The method comprises: heating a processing chamber to a temperature in a range of from 400° C. to 700° C., the processing chamber comprising a substrate, the substrate comprising at least one film stack and at least one feature, the film stack comprising alternating layers of silicon and silicon-germanium and the at least one feature extending a feature depth from a top surface of the film stack to a bottom surface; maintaining the processing chamber at a pressure in a range of from 3 Torr to 300 Torr; coflowing a silicon precursor and a germanium precursor into the processing chamber; and depositing a conformal silicon-germanium film on the substrate, the conformal silicon-germanium film having a conformality greater than or equal to 50%.

In other embodiments, a method of depositing a film comprises: exposing a substrate to a silicon precursor and a germanium precursor, the substrate comprising at least one film stack and at least one feature, the film stack comprising alternating layers of silicon and silicon-germanium, the at least one feature having an aspect ratio in a range of from 1:1 to 1:10 and a critical dimension in a range of from 5 nm to 30 nm; exposing the substrate to a plasma at a temperature in a range of from 100° C. to 250° C.; and depositing a conformal silicon-germanium film on the substrate, the conformal silicon-germanium film having a conformality greater than or equal to 50%, a silicon content in a range of from 50% to 90%, a germanium content in a range of from 10% to 50%, and a hydrogen content of less than or equal to 3%.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein refers to any substrate or material surface formed on a substrate upon which film processing is performed during a fabrication process. For example, a substrate surface on which processing can be performed include materials such as silicon, silicon oxide, strained silicon, silicon on insulator (SOI), carbon-doped silicon oxides, silicon-nitride, doped silicon, germanium, gallium-arsenide, glass, sapphire, and any other materials such as metals, metal nitrides, metal alloys, and other conductive materials, depending on the application. Substrates include, without limitation, semiconductor wafers and devices. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited and the particular chemistry used.

As used in this specification and the appended claims, the terms "precursor," "reactant," "reactive gas," and the like are used interchangeably to refer to any gaseous species that can react with the substrate surface. In one or more embodiments, the precursor is a silicon-based precursor. In one or more embodiments, the precursor is a germanium precursor.

As used herein, "chemical vapor deposition" or "CVD" refers to a process in which a substrate surface is exposed to precursors and/or co-reagents simultaneous or substantially simultaneously. As used herein, "substantially simultaneously" refers to either co-flow or where there is overlap for a majority of exposures of the precursors. As used herein, a "CVD process" can be either a thermal CVD process or a PECVD process performed in a CVD chamber.

One or more embodiments advantageously provide the formation of high-quality, stable insulating layers of silicon-germanium through the use of a thermal CVD process. One or more embodiments provide the formation of high-quality, stable insulating layers of silicon-germanium through the use of a PECVD process. Additionally, the CVD process of one or more embodiments forms high-quality conformal layers of a silicon-germanium film that have a high conformality (e.g., conformality greater than 50%).

Embodiments of the disclosure provide methods of depositing a film (e.g., amorphous-silicon-germanium) on features with small dimensions using a CVD chamber. Some embodiments advantageously provide conformal films to completely cover features. Other embodiments advantageously provide conformal films that completely or partially cover features. The silicon-germanium film of one or more embodiments has a high conformality. In one or more embodiments, the conformal silicon-germanium film is deposited on a logic device comprising alternating layers of silicon and silicon-germanium. In some embodiments, the logic device is a transistor, such as a FinFET or a GAA.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e. $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (Fin-FET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g. a transistor, in which the gate material surrounds the channel region on all sides. The channel region of a GAA transistor may include nano-wires or nano-slabs, bar-shaped channels, or other suitable channel configurations known to one of skill in the art. The channel region of a GAA device may have multiple horizontal nanowires or horizontal bars vertically spaced, making the GAA transistor a stacked horizontal gate-all-around (hGAA) transistor. "Chemical vapor deposition" or "CVD" as used herein refers to a vacuum deposition method involving the simultaneous exposure of two or more reactive compounds to deposit a layer of material on a substrate surface. As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). The substrate, or portion of the substrate, is exposed simultaneously to the two or more reactive compounds which are introduced into a reaction zone of a processing chamber. In chemical vapor deposition a substrate surface is exposed to precursors and/or co-reagents simultaneous or substantially simultaneously. As used herein, "substantially simultaneously" refers to either co-flow or where there is overlap for a majority of exposures of the precursors.

In some embodiments, a purge may be performed before and/or after the exposure of the substrate to the process gases, wherein an inert gas is used to perform the purge. For example, a first process gas and a second process gas may be provided to the process chamber substantially simultaneously followed by a purge with an inert gas. In some embodiments, the inert gas may be continuously provided to the process chamber and the first process gas and the second process gas may be dosed or pulsed into the process chamber.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Provided herein are methods of depositing conformal silicon-germanium films using CVD. According to one or more embodiments, silicon-germanium films are deposited by thermal CVD onto substrates having film stacks and features to insulate the film stacks and features. In one or more embodiments, silicon-germanium films are deposited by PECVD onto film stacks and features on substrates to insulate the film stacks and features. The conformal silicon-germanium film of one or more embodiments provide high-quality thin barrier/liner layers on film stacks, features, and substrates.

The embodiments of the disclosure are described by way of the Figures, which illustrate devices (e.g. transistors) and processes for forming devices in accordance with one or more embodiments of the disclosure. The processes shown are merely illustrative possible uses for the disclosed processes, and the skilled artisan will recognize that the disclosed processes are not limited to the illustrated applications.

Figure 1A:
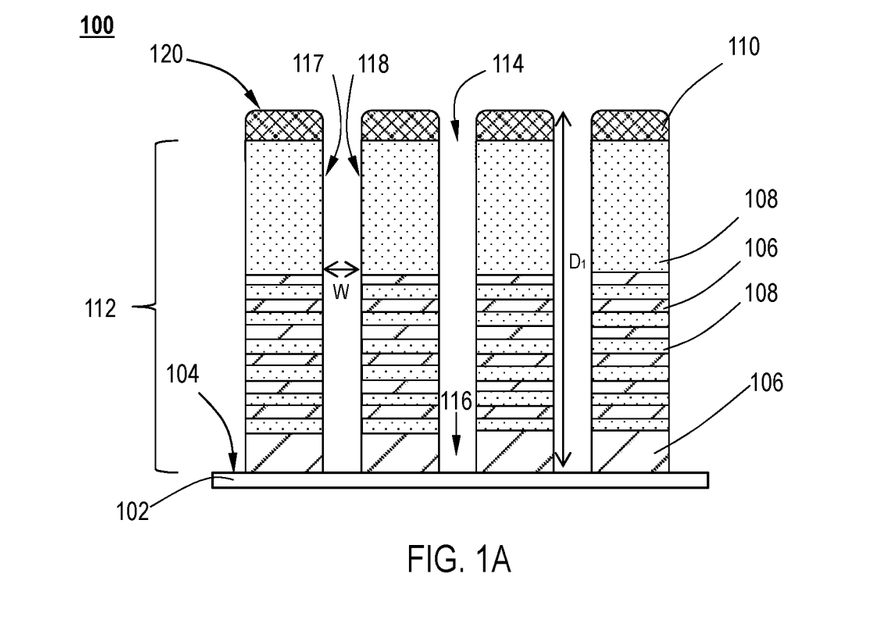
FIG. 1A illustrates a cross-sectional view of a substrate according to one or more embodiments.

One or more embodiments of the disclosure are described with reference to the Figures. FIG. 1A illustrates a cross-sectional view of a device 100 according to one or more embodiments. In one or more embodiments, the device 100 comprises a substrate 102 having a plurality of film stacks 112 thereon.

In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon-germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), silicon-germanium (SiGe), germanium-tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

In one or more embodiments, the film stack 112 comprises a plurality of alternating layers of a first material 106 and a second material 108. The first material 106 and the second material 108 may comprise any suitable material known to the skilled artisan. In one or more embodiments, the first material 106 comprises silicon (Si), and the second material 108 comprises silicon-germanium (SiGe). In one or more embodiments, the film stack 112 has a capping layer 110 on a top surface of the film stack 112. The capping layer 110 may comprise any suitable material known to the skilled artisan. In one or more embodiments, the capping layer 110 comprises silicon-nitride (SiN).

In one or more embodiments, the plurality of film stacks 112 are each separated by at least one feature 114. The shape of the at least one feature 114 can be any suitable shape including, but not limited to, peaks, trenches, and vias. As used in this regard, the term "feature" refers to any intentional surface irregularity. In one or more embodiments, the at least one feature 114 extends a depth $D_1$ from a top surface 120 of the film stack 112 to a top surface 104 of the substrate 102. In some embodiments, the bottom surface 116 of the at least one feature 114 comprises the top surface 104 of the substrate 102. In one or more embodiments, the at least one feature 114 has a first sidewall 117 and a second sidewall 118 that define a width W of the at least one feature 114. The open area formed by the first side wall 117, the second sidewall 118, and the bottom surface 116 may also referred to as a gap. In one or more embodiments, the width W is homogenous along the depth $D_1$ of the at least one feature 114. In other embodiments, the width W varies along the depth $D_1$ of the at least one feature 114. Features can have any suitable aspect ratio (ratio of the depth of the feature to a width of the feature) and any suitable critical dimension (CD). In some embodiments, the aspect ratio is in a range of from about 1:1 to about 10:1. In some embodiments, the feature width W has a critical dimension (CD) in a range of from about 5 nm to about 30 nm.

FIGS. 1A-1B and 2A-2C illustrates substrates having four film stacks and three features for illustrative purposes. Those skilled in the art, however, will understand that there can be any number of film stacks and features.

Figure 1B:
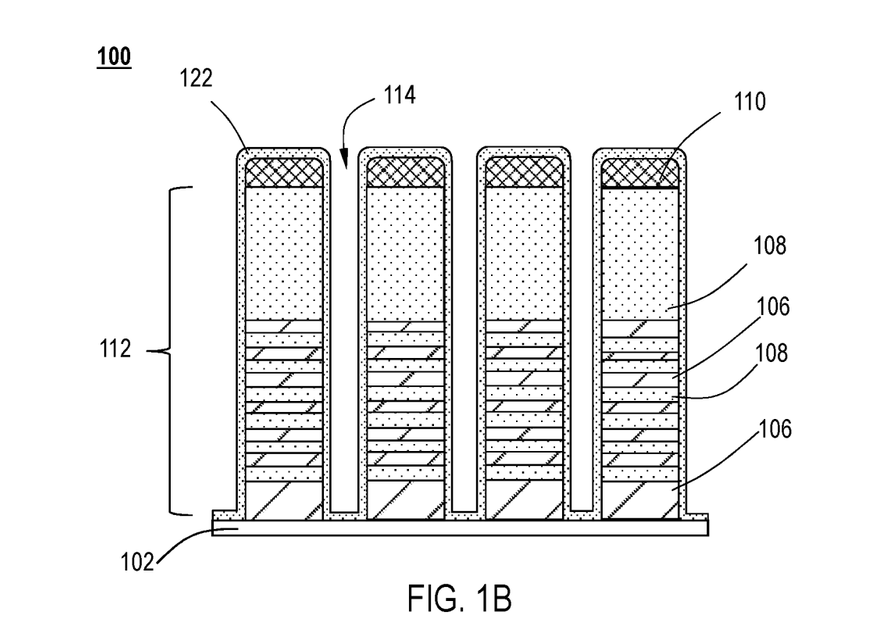
FIG. 1B illustrates a cross-sectional view of a substrate according to one or more embodiments.

Referring to FIG. 1B, in one or more embodiments, a silicon-germanium film 122 is deposited conformally on the device 100. In one or more embodiments, the silicon-germanium film 122 is deposited on the top surface 104 of the substrate 102, the top surface 120 of the film stack 112, and on the first sidewall 117, the second sidewall 118, and the bottom surface 116 of the feature 114. In one or more embodiments, the silicon-germanium film 122 is deposited by a CVD process.

In some embodiments, the silicon-germanium film 122 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film. In some embodiments, the silicon-germanium film 110 is a pinhole-free film. As used herein, the term "pinhole-free" refers to a layer that covers an entire exposed surface without gaps, bare spots, holes, pinholes, and the like that reveal material underlying the deposited layer. A pinhole-free layer may have holes or pinholes with a surface area less than about 1% of the total surface area of the film.

In one or more embodiments, the silicon-germanium film 122 is a conformal film. As used in this specification and the appended claims, the term "conformal" means that the film adapts to the contours of a feature or a layer. Conformality of a layer is typically quantified by a ratio of the average thickness of a layer deposited on the sidewalls of a feature to the average thickness of the same deposited layer on the field, or upper surface, of the substrate. Films deposited by the methods described herein are observed to have a conformality of greater than or equal to about 50%, such as 70% or greater, about 7:10 or greater, such as about 80% or greater, about 4:5 or greater, to about 100%, about 1:1, or to about 200% or greater, about 2:1. In one or more embodiments, the conformality of the silicon-germanium film 122 deposited on a feature with an aspect ratio of 1:10 having a width, W, and a critical dimension (CD) in a range of from 5 nm to 30 nm can be greater than about 90%. In specific embodiments, the conformality of the silicon-germanium film 122 is about 90%.

In one or more embodiments, the silicon-germanium film 122 is formed by coflowing the silicon precursor and the germanium precursor with a carrier gas into the reaction chamber. The carrier gas can be any suitable carrier gas known to the skilled artisan. In one or more embodiments, the carrier gas comprises one or more of hydrogen ($H_2$), helium (He), neon (Ne), and argon (Ar). While various carrier gases are available to coflow with the silicon precursor and the germanium precursor, without intending to be bound by theory, it is thought that using nitrogen can lead to silicon-nitride formation and affect the quality and conformality of the silicon-germanium film. Accordingly, in one or more embodiments, the carrier gas does not comprise nitrogen ($N_2$).

In one or more embodiments, the silicon precursor comprises one or more of disilane, trisilane, tetrasilane, dischlorosilane (DCS), and a polysilane. As used herein, the term "polysilane" refers to a class of organic-inorganic polymers with a polymer backbone made up of silicon-silicon bonds with two substituents attached to each silicon atom. The substituents are typically hydrogen, alkyl, and/or aryl groups. For example, in some embodiments, a polysilane includes, but is not limited to, dimethyl-polysilane (DMPS), poly(methyl phenyl silane) (PMPS), poly(phenyl silane) (PPSi), decaphenyl cyclopentasilane (DPPS), and poly(dimethylsilylene) ($[CH_3)_2Si]_x$), and the like. In one or more embodiments, the silicon precursor comprises disilane. In some embodiments, the silicon precursor comprises trisilane. In some embodiments, the silicon precursor comprises tetrasilane. In other embodiments, the silicon precursor comprises dichlorosilane. In further embodiments, the silicon precursor comprises a polysilane.

In one or more embodiments, the silicon precursor consists essentially of one or more of disilane, trisilane, tetrasilane, dischlorosilane (DCS), and a polysilane. As used in this manner, the term "consists essentially of" means that the silicon precursor comprises greater than or equal to about 95%, 98%, 99% or 99.5% of one or more of disilane, trisilane, tetrasilane, dischlorosilane (DCS), and a polysilane on a molecular basis. The presence of diluent, carrier and/or inert gases, for example, is not taken into consideration in the calculation. In one or more embodiments, the germanium precursor comprises one or more of germane ($GeH_4$), digermane ($Ge_2H_6$), trigermane ($Ge_3H_8$), and tetragermane ($Ge_4H_{10}$). In one or more embodiments, the germanium precursor comprises germane ($GeH_4$). In some embodiments, the germanium precursor comprises digermane ($Ge_2H_6$). In other embodiments, the germanium precursor comprises trigermane ($Ge_3H_8$). In further embodiments, the germanium precursor comprises tetragermane ($Ge_4H_{10}$).

In one or more embodiments, the germanium precursor consists essentially of one or more of one or more of germane ($GeH_4$), digermane ($Ge_2H_6$), trigermane ($Ge_3H_8$), and tetragermane ($Ge_4H_{10}$). As used in this manner, the term "consists essentially of" means that the germanium precursor comprises greater than or equal to about 95%, 98%, 99% or 99.5% of one or more of one or more of germane ($GeH_4$), digermane ($Ge_2H_6$), trigermane ($Ge_3H_8$), and tetragermane ($Ge_4H_{10}$) on a molecular basis. The presence of diluent, carrier and/or inert gases, for example, is not taken into consideration in the calculation.

In one or more embodiments, the ratio of the silicon precursor and the germanium precursor can be controlled to modify the silicon content of the silicon-germanium film 122.

In one or more embodiments, the silicon-germanium film 122 comprises less than 3% hydrogen, including less than 2% hydrogen, less than 1% hydrogen, and less than 0.5% hydrogen. In one or more embodiments, the silicon-germanium film has a silicon content in a range of from 50% to 90%. In one or more embodiments, the silicon-germanium film 122 has a germanium content in a range of from 10% to 50%. In specific embodiments, the silicon-germanium film 122 has a germanium content in a range of about 20% to 30%.

In one or more embodiments, the silicon-germanium film 122 has a thickness in the range of from about 5 nm to about 30 nm, from about 7 nm to about 22 nm, or from about 9 nm to about 15 nm. In specific embodiments, the silicon-germanium film 122 has a thickness of about 10 nm.

The thermal CVD process of one or more embodiments may be performed at a pressure in a range of from about 3 Torr to about 300 Torr, including a range of from about 5 Torr to about 200 Torr, or a range of from about 10 Torr to about 100 Torr. In specific embodiments, the pressure is about 13 Torr. In other specific embodiments, the pressure is about 100 Torr.

The process of one or more embodiments is a thermal CVD process where the surfaces 104, 117, 118, and 120 are exposed to a silicon precursor and a germanium precursor at a thermal CVD temperature to form a conformal silicon-germanium layer 122. In the thermal CVD process of one or more embodiments, the temperature is in a range of from 300° C. to 800° C., or in a range of from 400° C. to 700° C., or in a range of from 500° C. to 600° C. In specific embodiments, the temperature is about 540° C.

The process of one or more embodiments is a low-temperature plasma enhanced chemical vapor deposition (PECVD) process. In a PECVD process, for example, as a gas-phase material or a vapor of a liquid-phase material that has been entrained in a carrier gas, is introduced into a PECVD chamber. A plasma-initiated gas, typically helium, is also introduced into the chamber. Plasma is then initiated in the chamber to create excited radicals. The excited radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein. In the PECVD process of one or more embodiments, the device 100 is exposed to a silicon precursor, a germanium precursor, and a plasma. In the PECVD process of one or more embodiments, the temperature is in a range of from 100° C. to 250° C. to form the silicon-germanium film 122. In one or more embodiments, the duty cycle of the PECVD process is in a range of from 10% to 80%, and the power is in a range of from 50 W to 500 W.

Figure 2A:
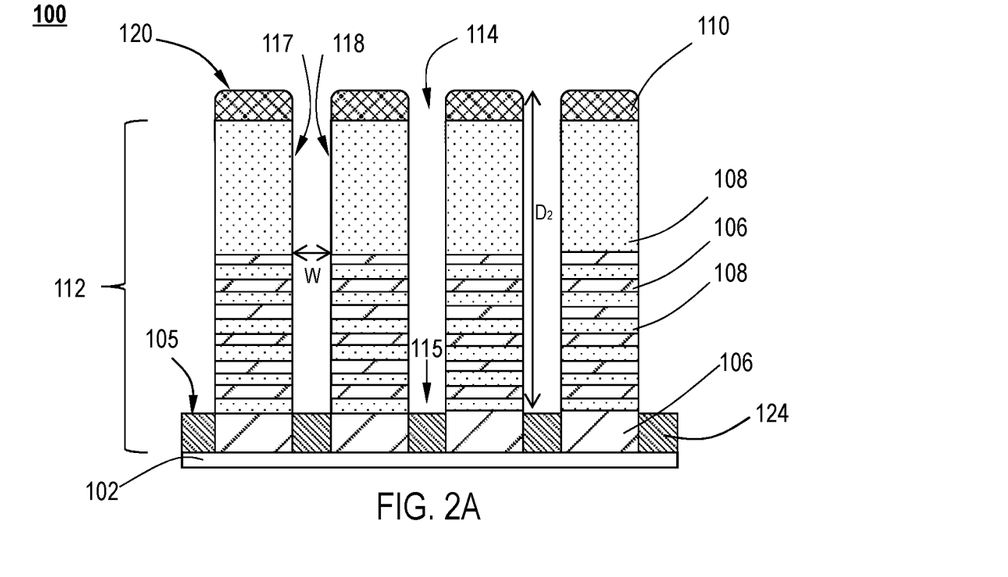
FIG. 2A illustrates a cross-sectional view of a substrate according to one or more embodiments.

FIG. 2A illustrates a cross-sectional view of a device 100 according to one or more embodiments. In one or more embodiments, the device 100 comprises a substrate 102 having a plurality of film stacks 112 thereon. In one or more embodiments, the film stack 112 comprises a plurality of alternating layers of a first material 106 and a second material 108. The first material 106 and the second material 108 may comprise any suitable material known to the skilled artisan. In one or more embodiments, the first material 106 comprises silicon (Si), and the second material 108 comprises silicon-germanium (SiGe). In one or more embodiments, the film stack 112 has a capping layer 110 on a top surface of the film stack 112. The capping layer 110 may comprise any suitable material known to the skilled artisan. In one or more embodiments, the capping layer 110 comprises silicon-nitride (SiN).

In one or more embodiments, the plurality of film stacks 112 are separated by at least one feature 114. Referring to FIG. 2A, in one or more embodiments, a dielectric layer 124 is formed on the top surface 104 of the substrate 102. Suitable dielectric materials include, but are not limited to, silicon oxide (SiO), silicon nitride (SiN), silicon carbide (SiC), aluminum oxide ($AlO_x$), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film. In one or more embodiments, the dielectric layer 124 comprises silicon oxide (SiO).

In one or more embodiments, the at least one feature 114 extends a depth $D_2$ from a top surface 120 of the film stack 112 to a bottom surface 115. In some embodiments, the bottom surface 115 of the at least one feature 114 comprises the top surface 105 of the dielectric layer 124. In one or more embodiments, the at least one feature 114 has a first sidewall 117 and a second sidewall 118, defining a width W. In some embodiments, the aspect ratio of the at least one feature 114 is in a range of from 1:1 to 10:1, and the at least one feature 114 has a critical dimension (CD) in a range of from 5 nm to 30 nm.

Figure 2B:
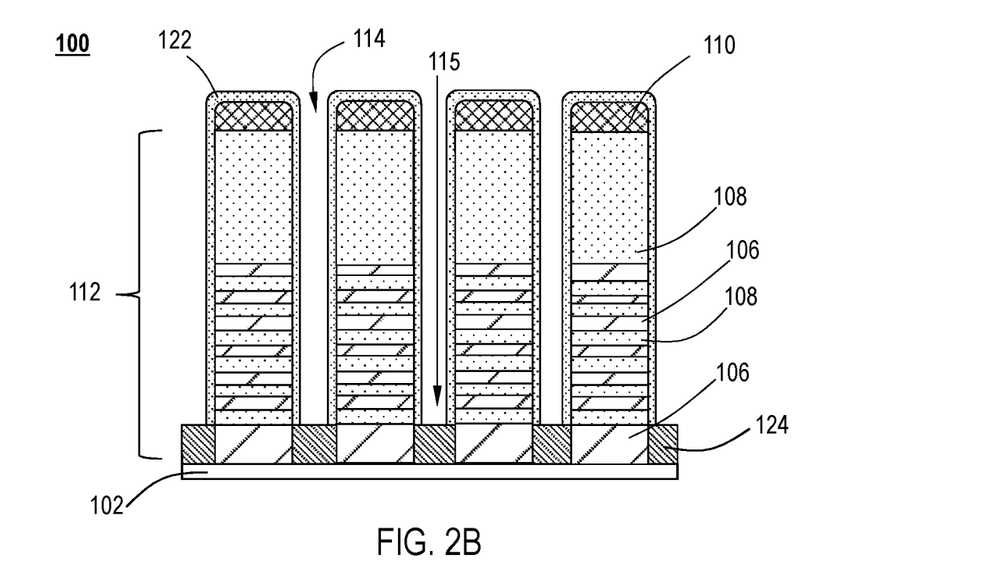
FIG. 2B illustrates a cross-sectional view of a substrate according to one or more embodiments.

Referring to FIG. 2B, a silicon-germanium film 122 is deposited conformally on the device 100. Specifically, the silicon-germanium film 122 is deposited on the top surface 105 of the dielectric layer 124, the top surface 120 of the plurality of film stacks 112, and on the first side wall 117 and the second side wall 118 of the feature 114. As illustrated in FIG. 2B, in one or more embodiments, the silicon-germanium layer 122 does not form on the bottom surface 115 of the feature. Thus, without intending to be bound by theory, the silicon-germanium layer 122 does not form on the dielectric layer 122.

Figure 2C:
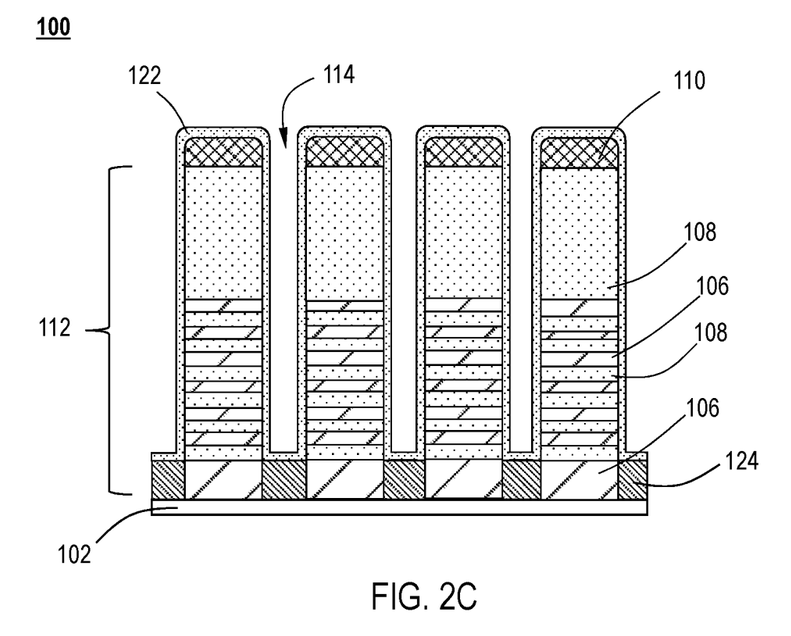
FIG. 2C illustrates a cross-sectional view of a substrate according to one or more embodiments.

FIG. 2C illustrates a cross-section view of device 100 according to one or more alternative embodiments. With reference to FIG. 2C, a silicon-germanium film 122 is deposited conformally on the device 100. Specifically, the silicon-germanium film 122 is deposited on the top surface 105 of the silicon oxide layer 124, the top surface 120 of the film stack 112, and on the first side wall 117, the second side wall 118, and on the bottom surface 115 of the feature 114.

Figure 3:
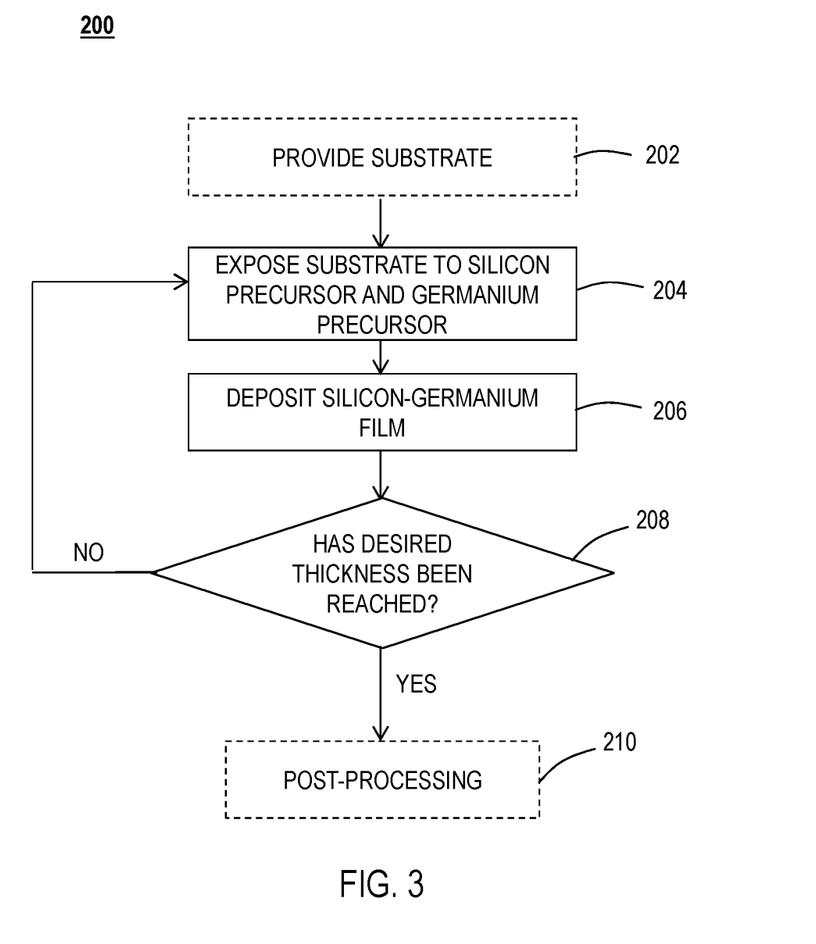
FIG. 3 illustrates a process flow diagram of a method according to one or more embodiments.

FIG. 3 illustrates a process flow diagram of a method 200 according to one or more embodiments the disclosure. The method illustrated in FIG. 3 is representative of a thermal chemical vapor deposition process in which the substrate or substrate surface is exposed simultaneously to the reactive gases such that reactive gases are mixed in the processing chamber to allow gas phase reactions of the reactive gases and deposition of the thin film. In one or more embodiments, at operation 202, a substrate is provided for processing. As used herein, the term "provided" means that the substrate is made available for processing (e.g., positioned in a processing chamber). It is noted that in some embodiments, the substrate may already be present in a reaction chamber. In one or more embodiments, the substrate is the substrate of one or more embodiments with a plurality of film stacks 112 comprising alternating layers of a first material 106 and a second material 108 and at least one feature 114 formed thereon. In one or more embodiments, at operation 204, the substrate is exposed to a silicon precursor and a germanium precursor. In some embodiments, the substrate is exposed to the silicon precursor and the germanium precursor simultaneously or substantially simultaneously. At operation 206, a silicon-germanium film is deposited on the substrate surface. At decision point 208, the thickness of the deposited film, or number of cycles of the process is considered. If the deposited film has reached a predetermined thickness or a predetermined number of process cycles have been performed, the method 200 moves to an optional post-processing operation 210. If the thickness of the deposited film or the number of process cycles has not reached the predetermined threshold, the method 200 returns to operation 204 to expose the substrate to a silicon precursor and a germanium precursor again.

In some embodiments, the method 200 may include an optional (not illustrated) purge operation, where the processing chamber is purged of the silicon precursor and the germanium precursor. In one or more embodiments, the purge gas is selected from one or more of hydrogen ($H_2$), helium (He), neon (Ne), and argon (Ar). Purging the processing chamber, portion of the processing chamber, area adjacent the substrate surface, etc., removes reaction products and by-products from the area adjacent the substrate surface.

Figure 4:
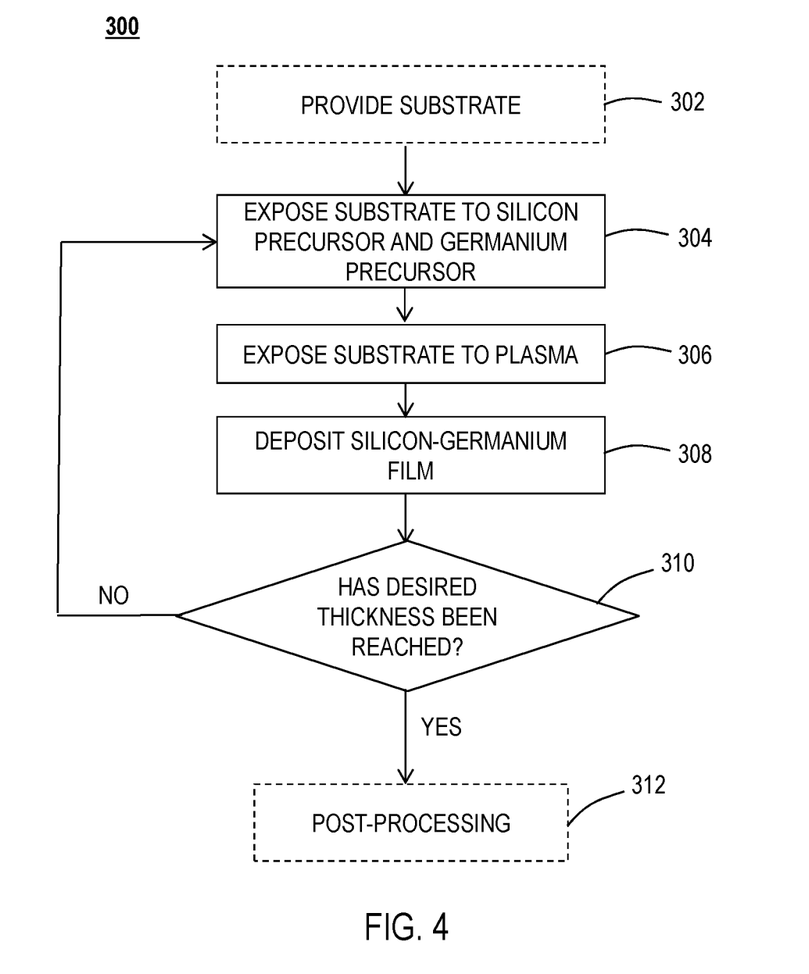
FIG. 4 illustrates a process flow diagram of a method according to one or more embodiments.

FIG. 4 illustrates a process flow diagram of a method 300 according to one or more embodiments of a PECVD process. The method illustrated in FIG. 4 is representative of a plasma enhanced chemical vapor deposition process. In one or more embodiments, at operation 302, a substrate is provided for processing. It is noted that in some embodiments, the substrate may already be present in a reaction chamber. In one or more embodiments, the substrate is the substrate of one or more embodiments with a plurality of film stacks 112 comprising alternating layers of a first material 106 and a second material 108 and at least one feature 114 formed thereon. In one or more embodiments, at operation 304, the substrate is exposed to a silicon precursor and a germanium precursor. In some embodiments, the substrate is exposed to the silicon precursor and the germanium precursor simultaneously or substantially simultaneously. At operation 306, the substrate is exposed to a plasma. In some embodiments, the plasma is a direct plasma. In other embodiments, the plasma is a remote plasma. At operation 308, a silicon-germanium film is deposited on the substrate surface. At decision point 310, the thickness of the deposited film, or number of cycles of the process is considered. If the deposited film has reached a predetermined thickness or a predetermined number of process cycles have been performed, the method 300 moves to an optional post-processing operation 312. If the thickness of the deposited film or the number of process cycles has not reached the predetermined threshold, the method 300 returns to operation 304 to expose the substrate to a silicon precursor and a germanium precursor again.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 50 W to about 500 W. In some embodiments, the plasma is generated with a plasma power less than or equal to about 500 W, less than or equal to about 400 W, less than or equal to about 300 W, or less than or equal to about 250 W.

The plasma may be generated via any suitable plasma generation process or technique known to those skilled in the art. For example, plasma may be generated by one or more of a microwave (MW) frequency generator or a radio frequency (RF) generator. In some embodiments, the silicon-germanium film may be formed during a PECVD process. In some embodiments, the use of plasma provides sufficient energy to promote a species into the excited state where surface reactions become favorable and likely. Introducing the plasma into the process can be continuous or pulsed. In some embodiments, the reagents may be ionized either directly (i.e., within the processing chamber) or remotely (i.e., outside the processing chamber).

The plasma of one or more embodiments is generated or ignited within the processing chamber (e.g., a direct plasma) by igniting the plasma gas to form a plasma. The plasma may be ignited at a regular interval. A "regular" interval means that the time of plasma ignitions is about equally spaced. In some embodiments, a regular interval means that the times that the plasma is ignited for is about the same. In some embodiments, regular intervals means that the plasma is ignited for about the same amount of time and the time difference between the ignitions is about the same. Stated differently, during processing, the plasma source will be switched on to generate the plasma and off to allow the plasma gas to remain unaffected by the plasma.

The cycling of the plasma can occur over any time frame. For example, the plasma may be on for one second and off for one second before the cycle repeats or the plasma may be on for 50 ms and off for 50 ms before the cycle repeats.

Similarly, the active and inactive periods of the plasma cycle may be uneven. For example, the plasma may be on for 400 ms and off for 100 ms or vice versa. The percentage of a cycle in which the plasma is active is referred to as the duty cycle of the plasma. For example, the 400 ms active and 100 ms inactive would be a duty cycle of about 80%.

In some embodiments, the regular interval has a duty cycle in a range of about 10% to about 90%. In some embodiments, the regular interval has a duty cycle that is less than or equal to about 80%, less than or equal to about 70%, less than or equal to about 60%, less than or equal to about 50%, less than or equal to about 40%, less than or equal to about 30%, less than or equal to about 25%, less than or equal to about 20%, less than or equal to about 15%, or less than or equal to about 10%.

In some PECVD processes, the plasma is generated external from the processing chamber, such as by a remote plasma generator system. The frequency of the plasma may be tuned depending on the specific precursor species being used. In one or more embodiments, the plasma frequency may be any suitable frequency. In some embodiments, the plasma has a frequency in a range of about 10 Hz to about 10 kHz. In some embodiments, the plasma frequency is less than or equal to about 10 kHz, less than or equal to about 5 kHz, less than or equal to about 2 kHz, less than or equal to about 1 kHz, less than or equal to about 500 Hz, less than or equal to about 200 Hz, less than or equal to about 100 Hz, less than or equal to about 50 Hz, or less than or equal to about 20 Hz. In some embodiments, the plasma frequency is greater than or equal to about 10 Hz, greater than or equal to about 20 Hz, greater than or equal to about 50 Hz, greater than or equal to about 100 Hz, greater than or equal to about 200 Hz, greater than or equal to about 500 Hz, greater than or equal to about 1 kHz, greater than or equal to about 2 kHz, or greater than or equal to about 5 kHz. Although plasmas may be used during the deposition methods disclosed herein, plasmas may not be requisite. Indeed, other embodiments relate to deposition methods without plasma.

In one or more embodiments, the power source is continuously on while the plasma is not because the power is being diverted to an alternative load to cause a duty cycle of the plasma. The cycling of the plasma can occur over any time frame. For example, the plasma may be on for one second and off for one second before the cycle repeats or the plasma may be on for 50 ms and off for 50 ms before the cycle repeats.

The processing chamber may be purged after exposure to the plasma. Purging the processing chamber in operation can be the same process or different process than the prior purge processes. Purging the processing chamber, portion of the processing chamber, area adjacent the substrate surface, etc., removes plasma, reaction products and by-products from the area adjacent the substrate surface.

The optional post-processing operation (210, 312) can be, for example, a process to modify film properties (e.g., annealing) or a further film deposition process (e.g., additional ALD or CVD processes) to grow additional films. In some embodiments, the post-processing operation (210, 312) can be a process that modifies a property of the deposited film. In some embodiments, the post-processing operation (210, 312) comprises annealing the film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time.

Embodiments described herein in reference to a thermal CVD method can be carried out using any suitable thin film deposition system. Examples of suitable systems include the PRECISION 5000® systems, PRODUCER® systems, PRODUCER® GT™ systems, PRODUCER® XP Precision™ systems, PRODUCER® SE™ systems, all of which are commercially available from Applied Materials, Inc., of Santa Clara, Calif. Other tools capable of performing CVD processes may also be adapted to benefit from the embodiments described herein. In addition, any system enabling the CVD methods described herein can be used to advantage. Any apparatus description described herein is illustrative and should not be construed or interpreted as limiting the scope of the implementations described herein.

In one or more embodiments, a CVD processing chamber may be controlled using a controller. The controller can be any suitable component that can control the processing chamber(s). For example, the controller can be a computer including a central processing unit (CPU), memory, inputs/outputs, suitable circuits, and storage.

Processes may generally be stored in the memory of the controller as a software routine that, when executed by the processor, causes the process chamber to perform processes of the present disclosure. The software routine may also be stored and/or executed by a second processor that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, a CVD processing chamber is part of a tool for processing one or more substrates. In some embodiments, a CVD processing chamber is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the PRODUCER® XP Precision and the PRECISION 5000® systems, both available from Applied Materials, Inc., of Santa Clara, Calif.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the substrate in use or operation in addition to the orientation depicted in the figures. For example, if the substrate in the figures is turned over, elements described as "below" or "beneath" other elements or features would then be oriented "above" the other elements or features. Thus, the exemplary term "below" may encompass both an orientation of above and below. The substrate may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "various embodiments," "one or more embodiments," or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment," or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A method of depositing a film on a semiconductor substrate, the method comprising:
exposing a semiconductor substrate to a silicon precursor and a germanium precursor to form a conformal silicon-germanium film on the semiconductor substrate, the semiconductor substrate comprising at least one film stack and at least one feature, the at least one film stack comprising a capping layer on a top surface of alternating layers of silicon and silicon-germanium, the at least one feature having a top surface, a bottom surface, a first sidewall, and a second sidewall and extending a feature depth from the top surface of the film stack to the bottom surface of the at least one feature, the conformal silicon-germanium film forming on the capping layer, the first sidewall, the second sidewall, and not on the bottom surface of the at least one feature, and the conformal silicon-germanium film having a conformality in a range of from 50% to 100%, a silicon content in a range of from 50% to 90%, a germanium content in a range of from 20% to 30%, and a hydrogen content of less than or equal to 3%.

2. The method of claim 1, further comprising exposing the substrate to a plasma at a temperature in a range of from 100° C. to 250° C.

3. The method of claim 2, wherein the plasma comprises a remote plasma or a direct plasma.

4. The method of claim 1, wherein the silicon precursor comprises one or more of disilane, trisilane, tetrasilane, dichlorosilane, and a polysilane.

5. The method of claim 1, wherein the germanium precursor comprises one or more of germane ($GeH_4$), digermane ($Ge_2H_6$), trigermane ($Ge_3H_8$), and tetragermane ($Ge_4H_{10}$).

6. The method of claim 1, wherein the silicon precursor and the germanium precursor are coflowed in a carrier gas, the carrier gas comprising one or more of hydrogen ($H_2$), helium (He), neon (Ne), and argon (Ar).

7. The method of claim 1, wherein the conformal silicon-germanium film has a thickness in a range of from 5 nm to 30 nm.

8. The method of claim 1, wherein the substrate is exposed to the silicon precursor and the germanium precursor in a processing chamber having a pressure in a range of from 3 Torr to 300 Torr and a temperature in a range of from 400° C. to 700° C.

9. The method of claim 1, wherein the at least one feature has an aspect ratio in a range of from 1:1 to 1:10 and a critical dimension in a range of from 5 nm to 30 nm.

10. A method of depositing a film on a semiconductor substrate, the method comprising:
heating a processing chamber to a temperature in a range of from 400° C. to 700° C., the processing chamber comprising a semiconductor substrate, the semiconductor substrate comprising at least one film stack and at least one feature, the at least one film stack comprising a capping layer on a top surface of alternating layers of silicon and silicon-germanium, the at least one feature having a top surface, a bottom surface, a first sidewall, and a second sidewall, and the at least one feature extending a feature depth from the top surface of the film stack to the bottom surface of the at least one feature, the bottom surface of the at least one feature comprising silicon oxide (SiO);
maintaining the processing chamber at a pressure in a range of from 3 Torr to 300 Torr; and
coflowing a silicon precursor and a germanium precursor into the processing chamber to form a conformal silicon-germanium film on the capping layer, and on the first sidewall, and the second sidewall of the at least one feature and not on the bottom surface, the conformal silicon-germanium film having a conformality greater than or equal to 50%, a silicon content in a range of from 50% to 90%, a germanium content in a range of from 20% to 30%, and a hydrogen content of less than or equal to 3%.

11. The method of claim 10, wherein the silicon precursor and the germanium precursor are coflowed in a carrier gas comprising one or more of argon (Ar), helium (He), and hydrogen ($H_2$).

12. The method of claim 10, wherein the silicon precursor comprises one or more of disilane, trisilane, tetrasilane, dichlorosilane, and a polysilane.

13. The method of claim 10, wherein the germanium precursor comprises one or more of germane ($GeH_4$), digermane ($Ge_2H_6$), trigermane ($Ge_3H_8$), and tetragermane ($Ge_4H_{10}$).

14. The method of claim 10, wherein the conformal silicon-germanium film has a thickness in a range of from 5 nm to 30 nm.

15. The method of claim 10, wherein the at least one feature has an aspect ratio in a range of from 1:1 to 1:10 and a critical dimension in a range of from 5 nm to 30 nm.

16. The method of claim 15, wherein the at least one film stack further comprises a capping layer on a top surface of alternating layers of silicon and silicon-germanium.

17. A method of depositing a film on a semiconductor substrate, the method comprising:
exposing a semiconductor substrate to a silicon precursor and a germanium precursor, the semiconductor substrate comprising at least one film stack and at least one feature, the at least one film stack comprising a capping layer on a top surface of alternating layers of silicon and silicon-germanium, the at least one feature having a top surface, a bottom surface, a first sidewall, and a second sidewall, and the at least one feature having an aspect ratio in a range of from 1:1 to 1:10 and a critical dimension in a range of from 5 nm to 30 nm; and
exposing the substrate to a plasma at a temperature in a range of from 100°° C. to 250° C., a duty cycle in a range of from 10% to 80%, and a power in a range of from 50 W to 500 W to deposit a conformal silicon-germanium film on the capping layer, the first sidewall, the second sidewall and not on the bottom surface of the at least one feature, the conformal silicon-germanium film having a conformality greater than or equal to 50%, a silicon content in a range of from 50% to 90%, a germanium content in a range of from 10% to 50%, and a hydrogen content of less than or equal to 3%.

* * * * *